(12) United States Patent
Sivakumar et al.

(10) Patent No.: US 8,860,184 B2
(45) Date of Patent: Oct. 14, 2014

(54) SPACER ASSISTED PITCH DIVISION LITHOGRAPHY

(75) Inventors: Swaminathan Sivakumar, Portland, OR (US); Elliot N. Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,077

(22) PCT Filed: Dec. 29, 2011

(86) PCT No.: PCT/US2011/067926
§ 371 (c)(1),
(2), (4) Date: Jun. 26, 2013

(87) PCT Pub. No.: WO2013/101105
PCT Pub. Date: Jul. 4, 2013

(65) Prior Publication Data
US 2014/0191372 A1    Jul. 10, 2014

(51) Int. Cl.
*H01L 29/06* (2006.01)
*H01L 23/58* (2006.01)
*H01L 21/44* (2006.01)
*H01L 21/02* (2006.01)

(52) U.S. Cl.
CPC .... *H01L 21/02587* (2013.01); *H01L 21/02658* (2013.01); *H01L 29/0684* (2013.01); *Y10S 438/942* (2013.01)
USPC ............ 257/618; 257/798; 257/E21.023; 257/E21.131; 257/E21.171; 438/669; 438/674; 438/942

(58) Field of Classification Search
USPC ............ 257/618, 798, E21.023, E21.131, 257/E21.171; 438/669, 674, 942
See application file for complete search history.

(56) References Cited

U.S. PATENT DOCUMENTS

| | | | |
|---|---|---|---|
| 7,737,440 B2 * | 6/2010 | Xiao | 257/48 |
| 8,304,334 B2 * | 11/2012 | Nakahata et al. | 438/604 |
| 8,435,874 B2 * | 5/2013 | Warrick et al. | 438/584 |
| 8,450,122 B2 * | 5/2013 | Marokkey | 438/14 |
| 8,450,833 B2 * | 5/2013 | Kim | 257/618 |
| 8,617,800 B2 * | 12/2013 | Hatakeyama et al. | 430/322 |
| 2006/0211260 A1 * | 9/2006 | Tran et al. | 438/763 |

(Continued)

FOREIGN PATENT DOCUMENTS

WO    2013/101105 A1    7/2013

OTHER PUBLICATIONS

International Search Report and Written Opinion received for PCT Patent Application No. PCT/US2011/067926, mailed on Sep. 26, 2012, 11 pages.

(Continued)

*Primary Examiner* — Ida M Soward
(74) *Attorney, Agent, or Firm* — Finch & Maloney PLLC

(57) ABSTRACT

Spacer-based pitch division lithography techniques are disclosed that realize pitches with both variable line widths and variable space widths, using a single spacer deposition. The resulting feature pitches can be at or below the resolution limit of the exposure system being used, but they need not be, and may be further reduced (e.g., halved) as many times as desired with subsequent spacer formation and pattern transfer processes as described herein. Such spacer-based pitch division techniques can be used, for instance, to define narrow conductive runs, metal gates and other such small features at a pitch smaller than the original backbone pattern.

20 Claims, 5 Drawing Sheets

(56) References Cited

U.S. PATENT DOCUMENTS

| | | |
|---|---|---|
| 2007/0249174 A1 | 10/2007 | Yang |
| 2007/0275309 A1* | 11/2007 | Liu .................................... 430/5 |
| 2008/0070165 A1 | 3/2008 | Fischer et al. |
| 2008/0296737 A1* | 12/2008 | Weis et al. .................... 257/623 |
| 2010/0075503 A1 | 3/2010 | Bencher et al. |
| 2010/0173492 A1 | 7/2010 | Kim et al. |
| 2011/0068436 A1* | 3/2011 | Culp et al. .................... 257/620 |
| 2011/0207330 A1* | 8/2011 | Ohuchi ........................ 438/703 |
| 2012/0171867 A1* | 7/2012 | Kim .............................. 438/702 |
| 2013/0147067 A1* | 6/2013 | Amoah et al. ................ 257/798 |

OTHER PUBLICATIONS

"Multiple Patterning," Wikipedia, downloaded from URL: http://en.wikipedia.org/wiki/Multiple Patterning, printed on Dec. 10, 2011, 8 pages.

* cited by examiner

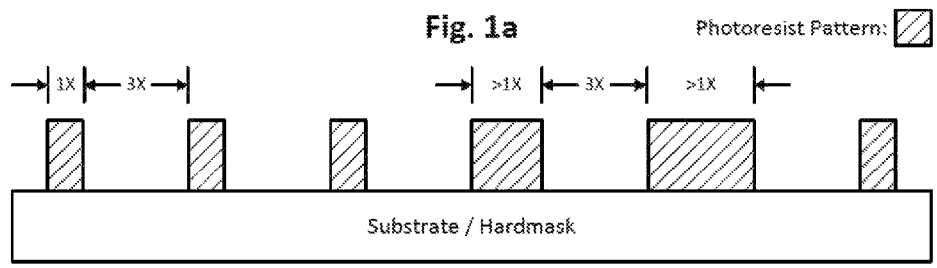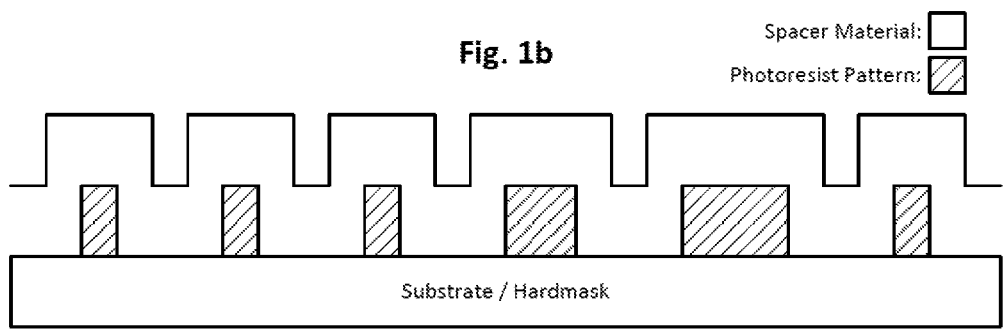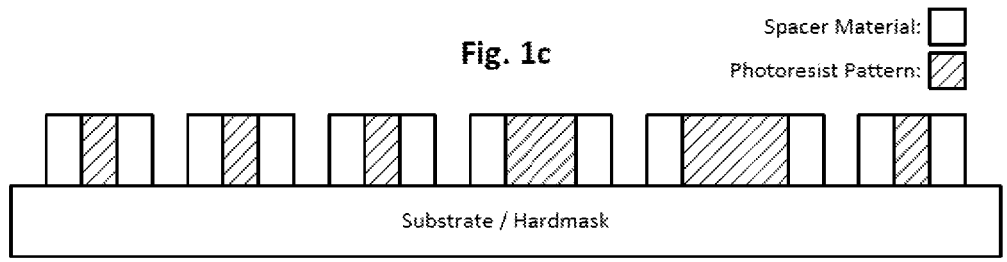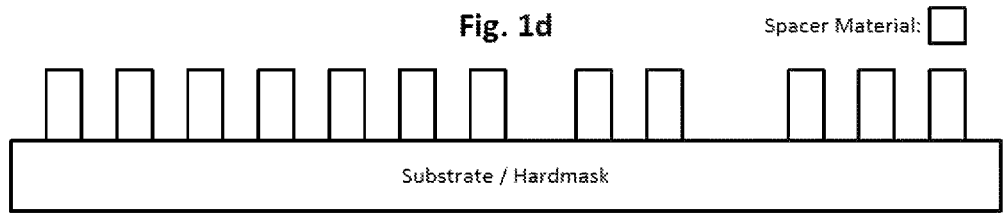

SPACER ASSISTED PITCH DIVISION LITHOGRAPHY

BACKGROUND

As is known, lithography is commonly used when manufacturing integrated circuits. The process generally includes forming a photoresist layer on the surface of a semiconductor wafer, and then positioning a mask over the resist-coated wafer. The mask typically has light non-transmissive (opaque) regions of chrome and light transmissive (transparent) regions of quartz. Radiation from a light source (e.g., ultra-violet or deep ultra-violet light, etc) and focused via an optical lens system is then applied to the mask. The light passes through the transparent mask regions and exposes the underlying photoresist layer, and is blocked by the opaque mask regions to leave those underlying portions of photoresist layer unexposed. Depending on the specific process used, either the exposed or non-exposed regions of the photoresist layer can then be removed, thereby leaving a patterned resist layer on the wafer, which in turn allows for subsequent processing of the wafer such as, for example, etching, depositing, and other typical semiconductor processes.

Spacer-based pitch division techniques allow for the realization of photoresist patterns below the resolution limit of the exposure system being used. However, there are a number of long-standing limitations associated with such spacer-based techniques that have yet to be addressed or otherwise resolved.

BRIEF DESCRIPTION OF THE DRAWINGS

FIGS. 1a-1d illustrate a series of cross-section views of integrated circuit structures demonstrating a spacer-based pitch division technique that yields a plurality of lines (or spaces) all having the same width.

FIG. 3g' illustrates a cross-section view of a structure produced by the spacer-based pitch division method of FIG. 2, in accordance with another embodiment of the present invention.

Figure 2:
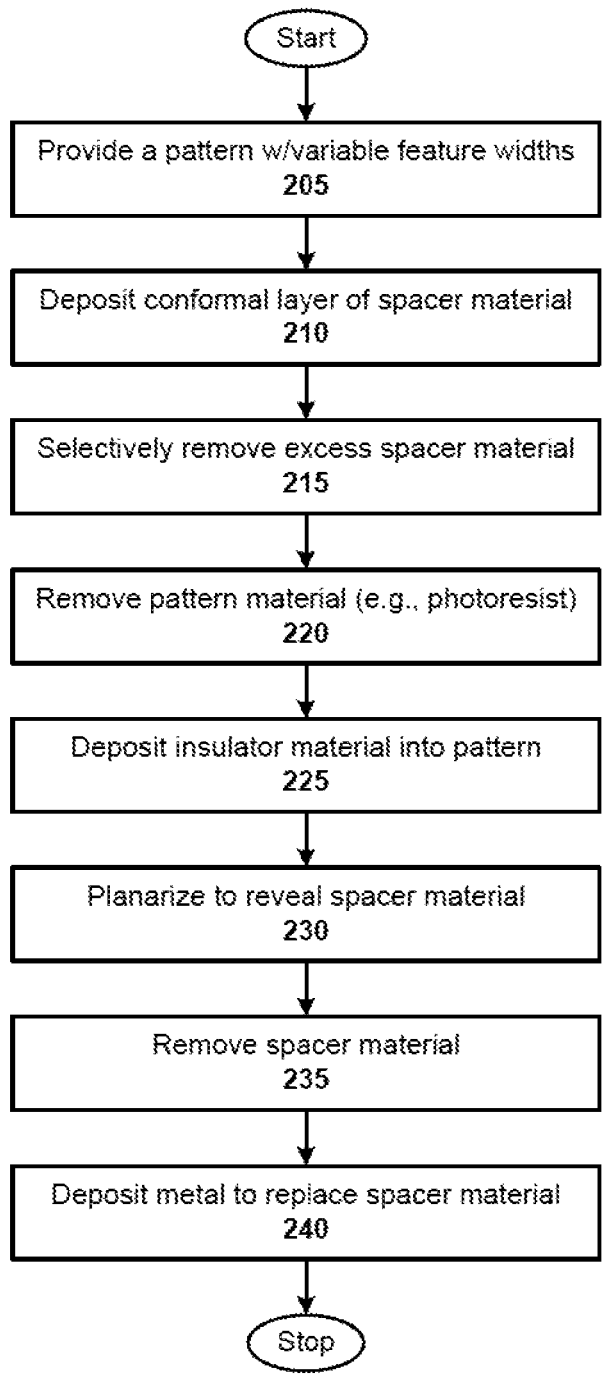
FIG. 2 illustrates a spacer-based pitch division method that yields a plurality of lines and spaces having variable thicknesses, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Spacer-based pitch division lithography techniques are disclosed that realize pitches with both variable line widths and variable space widths, and is accomplished using a single spacer deposition. The resulting feature pitches can be at or below the resolution limit of the exposure system being used, but they need not be, and may be further reduced (e.g., halved) as many times as desired with subsequent spacer formation and pattern transfer processes as described herein. Such spacer-based pitch division techniques can be used, for instance, to define narrow conductive runs, metal gates and other such small features at a pitch smaller than the original backbone/mandrel pattern.

General Overview

As previously explained, spacer-based pitch division techniques are associated with a number of problems. In more detail, such techniques generally involve deposition of a spacer layer on a previously provisioned backbone pattern (e.g., photoresist pattern, polysilicon pattern, oxide pattern, or other suitable backbone or mandrel pattern) having a number of lines and spaces. The spacer material deposition is then selectively etched to remove all spacer material on the horizontal surfaces of the underlying backbone pattern, thereby leaving spacer material only on the sidewalls of the pattern. The original patterned backbone features are then removed, thereby leaving only the sidewall spacer material. Given that there are two spacers for each patterned line (one for each sidewall), the line density has now doubled. Such techniques can be used, for instance, to define narrow conductive runs, metal gates and other such conductive features at half the pitch of the original backbone pattern. In this sense, spacer-based pitch division techniques allow for the realization of patterns below the resolution limit of the exposure system being used. Continuing with the fabrication process, a fill material is provided among the spacers and planarized, and then the spacer material is removed to provide narrow trenches that can then be filled with metal to provide conductive lines. However, the spacer thickness is constant everywhere. Thus, only one value of line width is possible. This is a significant limitation of typical spacer techniques for patterning layers where a plurality of line and space widths is an advantage.

Thus, and in accordance with an embodiment of the present invention, a spacer-based lithography process is provided to achieve tight line/space geometries that are, in some cases, at or below the resolution limit of the exposure system being used. However, in addition, such embodiments use distinctive fill characteristics of the resulting spacer structure to achieve both variable line widths and variable space widths, depending on the polarity and precise nature of the process flow.

In more detail, and in accordance with one specific example embodiment, a spacer-based lithography process is provided that includes provisioning a circuit pattern having a pitch/geometry greater than (or looser than) the final desired structure. In some such cases, note that the currently available exposure equipment may be incapable of patterning the target pitch/geometry of the final desired structure, although not necessarily so. The circuit pattern can be implemented, for instance, with any suitable material deposition and/or patterning on the substrate (e.g., organic, inorganic, molecular, or hybrid photoresist; polysilicon; oxide, etc), and may generally include any topology (e.g., pattern for backbone).

The process further includes depositing a spacer material of a certain thickness onto the circuit pattern. The thickness of the spacer material layer deposition can be selected, for instance, to deliver a particular minimum line width or space width (1x) depending on the polarity and precise nature of the process flow. The process further includes allowing the spacer material to completely or partially fill tight space geometries that are 2× or less, thereby effectively merging adjacent spacers into a single structure that could be up to 2× wider than the minimum width spacer.

The process further includes transferring the spacer pattern into a hardmask or substrate to achieve lines of varying widths. As will be appreciated, the process can be modified to reverse the pattern of the spacer, thereby achieving spaces of varying widths. The resulting lines/spaces can then be filled with a suitable material such as, for example, a conductive material (e.g., metal or metal alloy), an insulator material (e.g., oxide or nitride, having low or high dielectric constant), or other suitable material, depending on the desired function of the integrated circuit. Any number of process variations, material systems, and structure configurations can be implemented, as will be apparent in light of this disclosure, and the claimed invention in not intended to be limited to any such particular variations, systems, and configurations.

Thus, various embodiments of the present invention allow for variable line widths and space widths to be achieved with a single spacer deposition. In addition, one-half the minimum pitch of the original backbone pattern can be achieved for a given spacer deposition, and the pitch can be further halved as many times as desired with subsequent spacer formation and pattern transfer processes as described herein. An integrated circuit implementing the techniques will demonstrate, for instance, variable line widths and space widths in a single layer, achieved with a single spacer deposition.

Spacer-Based Process Flows

FIGS. 1a-1d illustrate a series of cross-section views of integrated circuit structures demonstrating a spacer-based pitch division technique that yields either a plurality of lines or spaces all having the same width, but not both lines and spaces of variable width. In more detail, FIG. 1a illustrates a photoresist pattern formed on a substrate. The example pattern is a backbone pattern and includes a number of photoresist lines. Some of the lines have a width of 1× and an adjacent space of 3×, thereby providing a patterned pitch of 4×, while other photoresist lines have a width greater than 1× with a space of 3×. Thus, a variable pitch is provided. However, as can be further seen, and in accordance with long-standing lithography design rules, there are no photoresist lines having a space therebetween that is 2× or less, where 1× refers to the thickness of the spacer material to be deposited to effect the desired pitch division.

FIG. 1b shows a cross-section of the resulting structure after a conformal film of spacer material is deposited on the photoresist pattern and substrate, and FIG. 1c shows a cross-section of the resulting structure after the conformal deposition of spacer material has been etched. As can be seen, the only spacer material deposition that remains is on the sidewalls of the photoresist pattern. Further note that the thickness of the sidewall spacer material in this example is 1×, or the same size as the smallest line width of the pattern, so as to provide a pitch-division effect.

As best shown in FIG. 1d, the photoresist pattern is subsequently removed, thereby leaving behind lines of spacer material having a single width (equal to the width of the conformally deposited spacer material), which in some instances have varying space width from each other. But the spacer material lines themselves are all the same width. Assuming a process having an opposite polarity (where lines become spaces and spaces become lines), then the spaces are all the same width and some of the lines can have varying widths. However, regardless of polarity, there is no instance where both the lines and spaces have more than one width for a given spacer material deposition. The tightest pitch of the resulting structure is two (where line width is 1× and the adjacent space width is 1×), which represents a halving of the originally patterned pitch of four shown in FIG. 1a (or said differently, a tightening of the pitch).

FIG. 2 illustrates a spacer-based pitch division method that yields a plurality of lines and spaces having variable thicknesses, in accordance with an embodiment of the present invention, and FIGS. 3a-3d illustrate a series of cross-section views of example structures produced by the spacer-based pitch division method of FIG. 2. The method can be carried out using any standard lithography equipment, and any number of semiconductor material systems and processes, as will be apparent in light of this disclosure. As will be further appreciated, some portions of the previous discussion with reference to FIGS. 1a-d regarding various common features shown in FIGS. 3a-d is equally applicable here. Additional structures including various preliminary and/or intermediate structures as well as the final integrated circuit are not shown, but can be implemented using any number of conventional or otherwise suitable fabrication techniques. The resulting integrated circuit can be, for example, a microprocessor, memory array, communication chip, logic array, or any other integrated circuit, for instance, having feature sizes that are below the resolution limit of the exposure system being used, and/or that could benefit from having a plurality line and space widths resulting from a single spacer deposition.

Figure 3A:
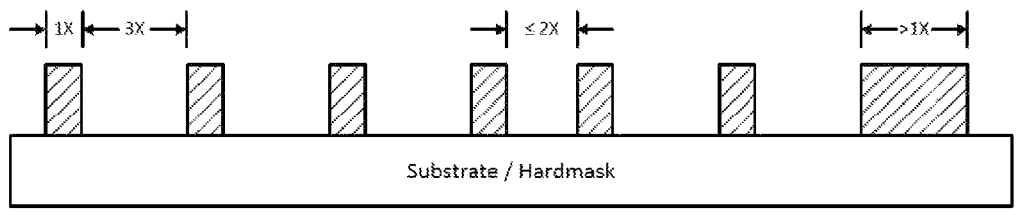
FIGS. 3a-3g illustrate a series of cross-section views of various structures produced by the spacer-based pitch division method of FIG. 2, each in accordance with an embodiment of the present invention.

The example method includes providing 205 a backbone pattern (e.g., photoresist, polysilicon, oxide, etc) having variable feature widths, including a plurality of line widths and a plurality of space widths. FIG. 3a illustrates one example such resulting structure, and shows a backbone pattern formed on a substrate, in accordance with an embodiment. The backbone pattern may be for any part of the integrated circuit being formed. As will be appreciated, backbone refers to target or desired topology to be formed by the pattern, which may be for instance a base topology upon which the remainder of the circuit is formed, or an intermediate topology. In a more general sense, backbone refers to the topology being formed, which can have any number of configurations depending on the given integrated circuit design. The backbone pattern can be formed using any suitable materials and lithography patterning processes (e.g., litho-etch litho-etch or LELE, litho-freeze litho-etch or LFLE, etc). In some example cases, the backbone pattern is implemented with photoresist. The photoresist may be, for example, an organic photoresist material (e.g., poly(methyl methacrylate), poly(dimethyl glutarimide), phenol formaldehyde resin, SU-8, or other polymer), an inorganic photoresist material (e.g., chalcogenides), a molecular photoresist material (e.g., truxene), a hybrid photoresist material (e.g., organic-inorganic), or any other material suitable for patterning on the substrate. In other example cases, the backbone pattern is implemented with some other sacrificial material, such as polysilicon or oxide. In short, the backbone pattern can be any suitable material that can be patterned, and the claimed invention is not intended to be limited to any particular type of materials. As can be further seen, the example backbone pattern includes a number of features. Some of the features have a width of 1× and a space of 3×, thereby providing an initial pitch of 4×, while other pattern features have a width greater than 1× with a space of 3×. Thus, at least this portion of the circuit will have variable pitch. In addition, further note that two of the pattern features (e.g., lines) are separated by a space that is less than or equal to 2×. Only one such space is shown, but other embodiments may include any number of such small spaces. Note that in such cases having multiple such small spaces, the spaces may have all the same width (e.g., 1.5× or 2×) or a plurality of widths that are less than or equal to 2× (e.g., 1×, 1.5×, and 2×).

Any number of suitable substrates can be used, including bulk substrates (e.g., metal, glass, silicon, germanium, III-V semiconductor materials, oxide, nitride, combinations thereof, or other suitable semiconductor substrate materials), semiconductor-on-insulator substrates (xOI, where x is a semiconductor material such as silicon or germanium or germanium-enriched silicon), and multi-layered structures. In one specific example case, the substrate is a silicon bulk substrate. In another specific example case, the substrate is a silicon-on-insulator (SOI) substrate. The substrate may have any thickness suitable for a given set of processes and target application. Any number of material systems and configurations can be used to implement the substrate, as will be apparent.

Figure 3B:
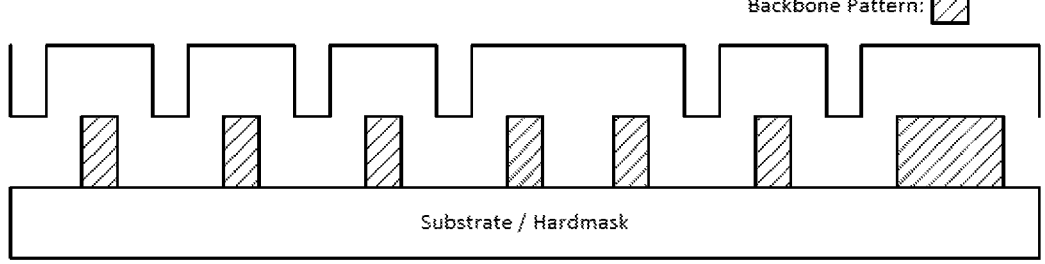

With further reference to FIG. 2, the method continues with depositing 210 a conformal layer of spacer material. FIG. 3b shows a cross-section of an example resulting structure after a conformal film of spacer material is deposited on the backbone pattern and substrate, in accordance with an embodiment of the present invention. Any number of spacer material deposition techniques can be used, such as chemical vapor deposition (CVD), atomic layer deposition (ALD), spin-on deposition (SOD), or any other suitably directional deposition technique that is capable of providing conformal layers. The spacer material may be implemented with any organic or inorganic materials that can be deposited conformally such as, for example, polymers, oxides (e.g., silicon dioxide, germanium oxide, I-V material oxides), nitrides (e.g., silicon nitride, silicon oxynitride, carbon doped nitride, III-V material nitrides), carbide (e.g., silicon carbide, germanium carbide), polysilicon, CVD carbon hardmasks, and glass. The claimed invention is not intended to be limited to any particular type of spacer materials, or to any particular spacer material deposition. As will be appreciated, a difference between this example embodiment and the structures shown in FIGS. 1a-b is that space equal to or less than 2× the width of the deposited conformal spacer material is patterned in the circuit. As can be seen in FIG. 3b, spaces that are 2× or less than the width of the conformal spacer material deposition are filled by the spacer material. Note in some cases, such as those where the space is about 2× (e.g., +/−10%), there may be a relatively shallow dimple in the spacer material deposition above the patterned space (e.g., partial fill). Such a partial fill may be completely removed in a subsequent planarization process. If the dimple is deep enough to reach past the planarization plane and into the actual space between the pattern features, that may or may not be acceptable, depending on subsequent processing and as will be appreciated. For instance, in some process flows, the spacer material is removed after a subsequent semiconductor material deposition to fill the spaces, which would also remove any dimple. In cases where such a dimple must be avoided, it can be filled and planarized as desired, or otherwise avoided by setting that particular space width accordingly (e.g., <2× space width, as opposed to a space width that is equal to or slightly greater than 2× such as 110% of 2×), so that the spacer material deposition yields a full fill of the space. In any case, the claimed invention is not intended to be limited to complete spacer material fills, and partial fills may be used as well, in accordance with some example embodiments.

Figure 3C:
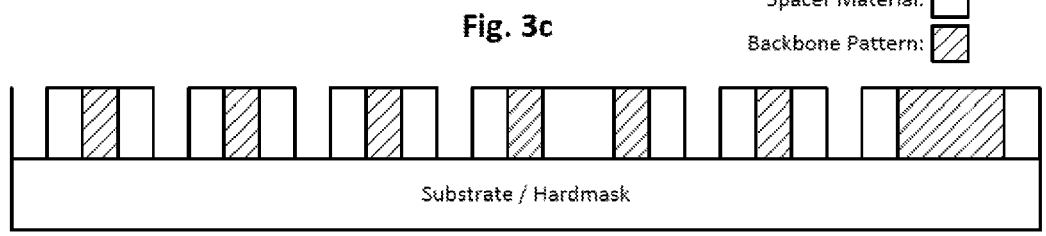

The method continues with removing 215 excess spacer material so as to reveal a top surface of the backbone pattern, as well as to reveal a top surface of the substrate below spaces of the pattern having widths that are greater than 2×. This removal of excess spacer material may be accomplished, for example, by selectively etching the spacer material layer, and may further include other processing such as planarization/polishing (e.g., chemical mechanical planarization). FIG. 3c shows a cross-section of an example resulting structure after the conformal deposition of spacer material has been selectively removed, in accordance with an embodiment of the present invention. As can be seen, the only spacer material deposition that remains is that on the sidewalls of the backbone pattern. The selective etch can be carried out, for instance, using an anisotropic etch or any other suitably directional or otherwise selective process that removes spacer material so as to leave behind spacers on the pattern sidewalls. Note that the thickness of the sidewall spacer material in this example embodiment is 1×, or the same size as the smallest line width of the backbone pattern. Other thicknesses can be used as well, as will be appreciated. Further note that the spacer material removal process leaves behind the spacers around the pattern with spacing of 1× in locations where the spaces are 3× in the pattern of FIG. 3a, but leaves behind a fill of spacer material in spaces between pattern features that are 2× or less in width (where 1× is the thickness of the spacer material). Again, a CMP process can be used to remove excess deposition materials, dimples, or other imperfections or otherwise undesired features.

Figure 3D:
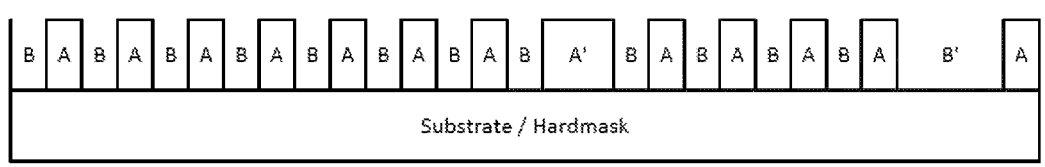

The method continues with removing 220 the backbone pattern material (e.g., photoresist, or other previously patterned sacrificial material). In more detail, and as best shown in FIG. 3d, and in accordance with one example embodiment, the patterned backbone material is subsequently removed, thereby leaving behind lines that are defined by the spacer material and that are any width between 1× and 2× depending on what the space width between the pattern lines was. In the specific example embodiment of FIG. 3d, the multiple line widths include A and A'. In addition, the variable sizes of the pattern features yield a range of space widths between the spacers. In this specific example embodiment, for instance, the multiple space widths include B and B'. In this manner, one-half the minimum pitch of the backbone pattern is achieved, as well as variable line widths and space widths, with a single spacer deposition. The pattern can be removed using any number of suitable processes, such as wet and/or dry etches, or a combination thereof, or any other process capable or selectively removing the photoresist (or other backbone pattern material).

Figure 3E:
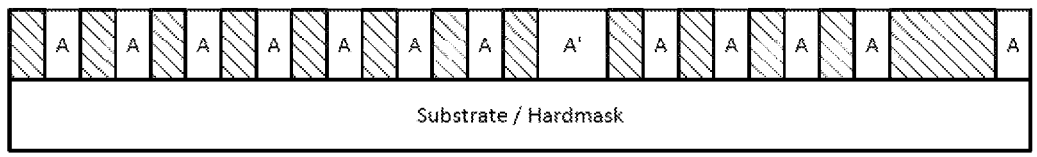
Figure 3F:
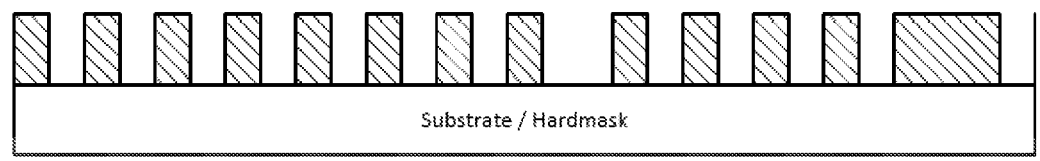
Figure 3G:
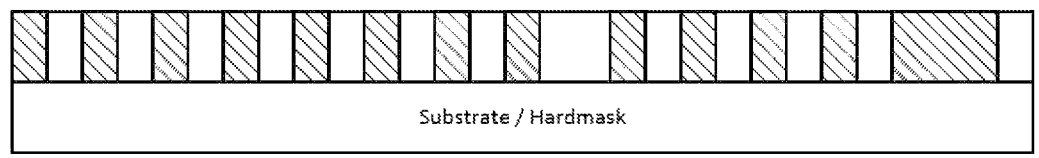
Figure 3G:
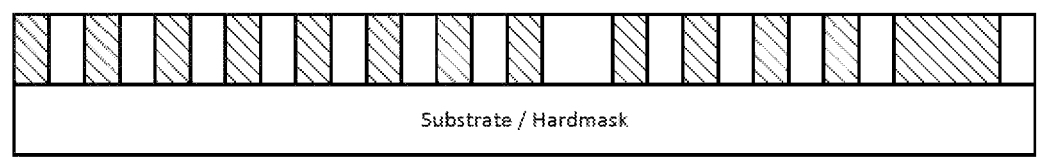

Depending on the process polarity and desired final configuration of the integrated circuit, the process flow may vary. For instance, in the embodiment shown, the method continues with depositing 225 a first semiconductor material into the voids left by the removed backbone material (generally referred to as backbone line voids), and then planarizing 230 to reveal spacer material. The first semiconductor material may be an insulator (e.g., silicon dioxide, silicon nitride, or any suitable insulator material or compound) or a conductor (e.g., copper, silver, aluminum, gold, nickel, titanium, palladium, or any suitable metal or alloy thereof). An example resulting structure is shown in FIG. 3e. The method continues with removing 235 the spacer material of variable widths A and A' (as best shown in FIG. 3f), and then depositing 240 a second semiconductor material into the voids left by the removed spacer material (generally referred to as spacer material line voids), and planarizing if so desired (as best shown in FIG. 3g). The second semiconductor material may be an insulator or a conductor, and in some example cases is the opposite of the first semiconductor material. For instance, in some example cases, the first semiconductor material is an insulator and the second semiconductor material is a conductor. Thus, the resulting example structure includes conductive lines of varying widths A and A' as well as insulative spaces of varying widths B and B'. The removal 235 and deposition 240 can be carried out, for instance, using anisotropic etch (e.g., wet and/or dry) and CVD or ALD processes. Other suitable etch and deposition processes can be used as well, and the claimed invention is not intended to be limited to any particular set of etch or deposition processes.

Process Polarity

Assuming a process having an opposite polarity of the one shown in FIG. 2, and as will be appreciated in light of this disclosure, then spaces would be defined by the spacer material and have any width between 1× and 2× (e.g., in such an opposite polarity process, space widths would include A and A'), and the variable sizes of the backbone pattern features would yield a range of line widths (e.g., in such an opposite polarity process, line widths would include B and B'). Thus, while opposite in polarity, the example resulting structure will still exhibit variable line widths and space widths, as well as one-half the minimum pitch of the backbone pattern. One such resulting structure having an opposite polarity from that in FIG. 3g is shown in FIG. 3g', which includes insulator features having widths of A and A' and conductive features having widths of B and B'.

A number of process flows variation can be used. For instance, with respect to the example integrated circuit structure shown in FIG. 3g', note that the process flow of FIG. 2 can be used up to and including etching 325 to remove the backbone pattern. However, in one example case, the method thereafter could include depositing metal into the backbone line voids, and planarizing as desired. In such examples, note that the spacer material can be used in the final circuit structure as an insulator, if so desired. As such, additional processing associated with removal and placement of the spacer material could be eliminated. In a similar fashion, the spacer material deposition could be a conductive material (e.g., metal or metal alloy), and be left in the final circuit to provide conductive lines. Numerous other process flow variations will be apparent in light of this disclosure.

Example System

Figure 4:
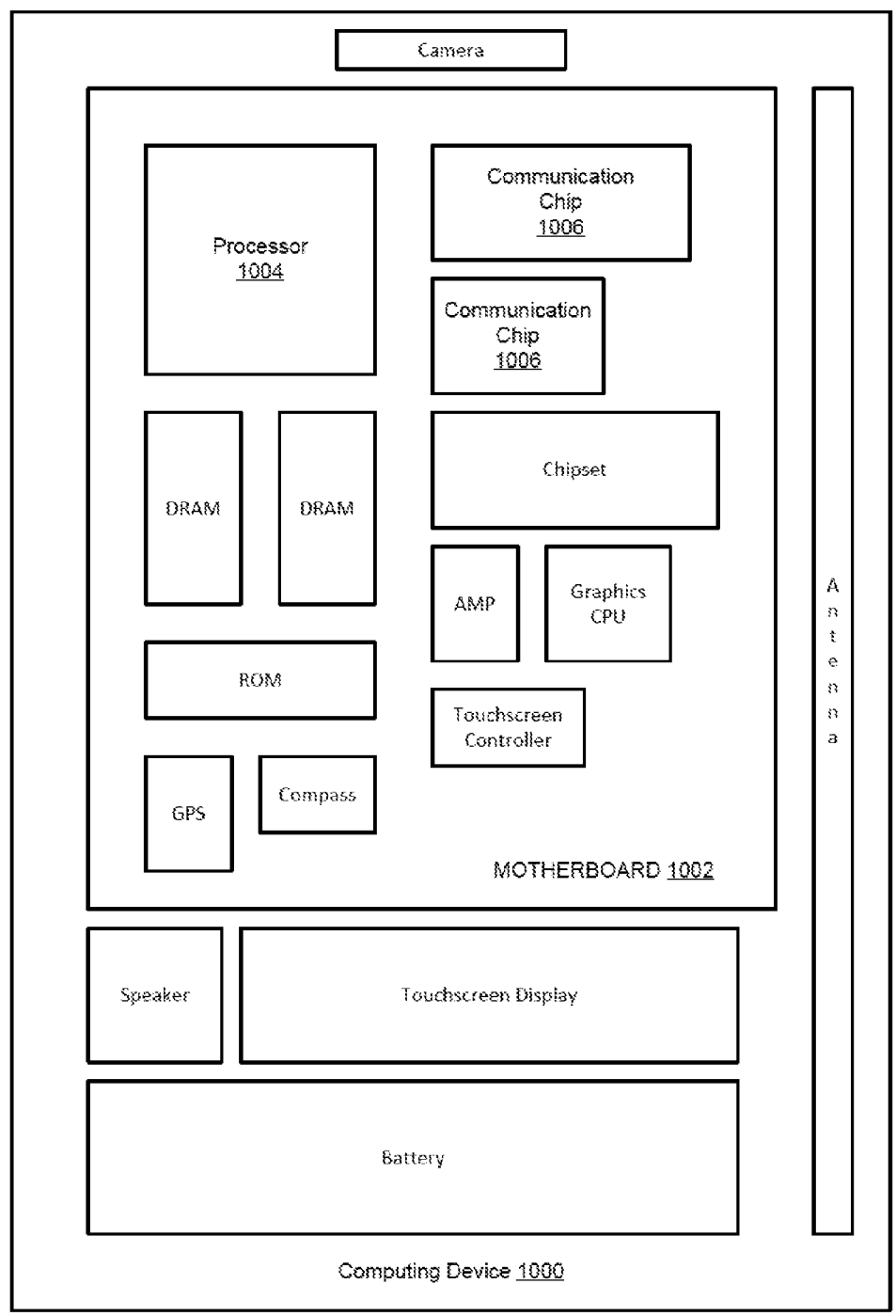
FIG. 4 illustrates a computing system implemented with one or more integrated circuit structures configured and/or otherwise fabricated in accordance with an example embodiment of the present invention.

FIG. 4 illustrates a computing system 1000 implemented with one or more integrated circuit structures configured and/or otherwise fabricated in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures formed as described herein, using spacer-based pitch division lithography techniques that realize pitches with both variable line widths and variable space widths. These integrated circuit structures can be used, for instance, to implement an on-board processor cache or memory array or other circuit feature. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures formed as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more integrated circuit structures formed as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit features formed as described herein (using spacer-based pitch division lithography techniques that realize pitches with both variable line widths and variable space widths).

Numerous embodiments will be apparent, and features described herein can be combined in any number of configurations. One example embodiment of the present invention provides a method for fabricating an integrated circuit. The method includes providing a variable pitch backbone pattern on a substrate, the pattern having two or more line widths and two or more space widths. The method further includes depositing a conformal layer of spacer material on the pattern and substrate, wherein the conformal layer has a thickness of 1×, and at least one of the space widths of the pattern is 2× or less and is filled with the spacer material. The method further includes removing excess spacer material so as to reveal a top surface of the backbone pattern and to reveal a top surface of the substrate below space widths of the pattern that are greater than 2×, wherein spacer material having a thickness of 1× remains on sidewalls of the pattern, and space widths of the pattern that are 2× or less remain at least partially filled with the spacer material. In some cases, the method includes removing backbone pattern material thereby leaving one or more backbone line voids having a first width and one or more other backbone line voids having a second width, and depositing a first semiconductor material into the backbone line voids. In one such case, the method includes planarizing the first semiconductor material to reveal the remaining spacer material. In some cases, the first semiconductor material is an insulator. In other cases, the first semiconductor material is a conductor. In some cases, the method includes removing the remaining spacer material thereby leaving one or more spacer material line voids having a first width and one or more other spacer material line voids having a second width, and depositing a second semiconductor material into the spacer material line voids. In one such case, the method includes planarizing the second semiconductor material to reveal the first semiconductor material. In some cases, the second semiconductor material is an insulator. In other cases, the second semiconductor material is a conductor. For instance, in one specific case, the first semiconductor material is an insulator and the second semiconductor material is a conductor. In some cases, the pattern has a minimum pitch that is halved at least once by carrying out the method, thereby providing a final minimum pitch. In one such case, the final minimum pitch is below the resolution limit of an exposure system being used to carry out the method. Numerous variations will be apparent in light of this disclosure. For instance, another embodiment of the present invention provides an integrated circuit fabricated using the method as variously described in this paragraph. Another embodiment provides an electronic device comprising one or more of such an integrated circuit. In one such case, the electronic device comprises at least one of a memory circuit, a communication chip, a processor, and/or a computing system. Another embodiment provides a lithography system for carrying out the method as variously in this paragraph. In one such example case, the system includes a lithography mask for providing the variable pitch backbone pattern.

Another embodiment of the present invention provides a partially-formed integrated circuit. The circuit includes a variable pitch backbone pattern on a substrate, the pattern having two or more line widths and two or more space widths. The circuit further includes a selectively provisioned conformal layer of spacer material on the pattern and substrate, wherein the conformal layer has a thickness of 1×, and at least one of the space widths of the pattern is 2× or less and is filled with the spacer material, and wherein excess spacer material has been removed so as to reveal a top surface of the backbone pattern and to reveal a top surface of the substrate below space widths of the pattern that are greater than 2×, wherein spacer material having a thickness of 1× remains on sidewalls of the pattern, and space widths of the pattern that are 2× or less remain at least partially filled with the spacer material. In some cases, backbone pattern material is removed thereby leaving one or more backbone line voids having a first width and one or more other backbone line voids having a second width, and a first semiconductor material is deposited into the backbone line voids. In some cases, the remaining spacer material is removed thereby leaving one or more spacer material line voids having a first width and one or more other spacer material line voids having a second width, and a second semiconductor material is deposited into the spacer material line voids.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method for fabricating an integrated circuit, comprising:
    providing a variable pitch backbone pattern on a substrate, the pattern having two or more line widths and two or more space widths;
    depositing a conformal layer of spacer material on the pattern and substrate, wherein the conformal layer has a thickness of 1×, and at least one of the space widths of the pattern is 2× or less and is filled with the spacer material; and
    removing excess spacer material so as to reveal a top surface of the backbone pattern and to reveal a top surface of the substrate below space widths of the pattern that are greater than 2×, wherein spacer material having a thickness of 1× remains on sidewalls of the pattern, and space widths of the pattern that are 2× or less remain at least partially filled with the spacer material.

2. The method of claim 1 further comprising:
    removing backbone pattern material thereby leaving one or more backbone line voids having a first width and one or more other backbone line voids having a second width; and
    depositing a first semiconductor material into the backbone line voids.

3. The method of claim 2 further comprising:
    planarizing the first semiconductor material to reveal the remaining spacer material.

4. The method of claim 2 wherein the first semiconductor material is an insulator.

5. The method of claim 2 wherein the first semiconductor material is a conductor.

6. The method of claim 2 further comprising:
    removing the remaining spacer material thereby leaving one or more spacer material line voids having a first width and one or more other spacer material line voids having a second width; and
    depositing a second semiconductor material into the spacer material line voids.

7. The method of claim 6 further comprising:
    planarizing the second semiconductor material to reveal the first semiconductor material.

8. The method of claim 7 wherein the second semiconductor material is an insulator.

9. The method of claim 7 wherein the second semiconductor material is a conductor.

10. The method of claim 6 wherein the first semiconductor material is an insulator and the second semiconductor material is a conductor.

11. The method of claim 6 wherein the pattern has a minimum pitch that is halved at least once by carrying out the method, thereby providing a final minimum pitch.

12. The method of claim 11 wherein the final minimum pitch is below the resolution limit of an exposure system being used to carry out the method.

13. An integrated circuit fabricated using the method of claim 1.

14. An electronic device comprising one or more of the integrated circuit of claim 13.

15. The electronic device of claim 14, wherein the device comprises at least one of a memory circuit, a communication chip, a processor, and/or a computing system.

16. A lithography system configured for carrying out the method of claim 1.

17. The lithography system of claim 16 further comprising a mask for providing the variable pitch backbone pattern.

18. A partially-formed integrated circuit, comprising:
a variable pitch backbone pattern on a substrate, the pattern having two or more line widths and two or more space widths;
a selectively provisioned conformal layer of spacer material on the pattern and substrate, wherein the conformal layer has a thickness of 1×, and at least one of the space widths of the pattern is 2× or less and is filled with the spacer material; and
wherein excess spacer material has been removed so as to reveal a top surface of the backbone pattern and to reveal a top surface of the substrate below space widths of the pattern that are greater than 2×, wherein spacer material having a thickness of 1× remains on sidewalls of the pattern, and space widths of the pattern that are 2× or less remain at least partially filled with the spacer material.

19. The integrated circuit of claim 18 wherein backbone pattern material is removed thereby leaving one or more backbone line voids having a first width and one or more other backbone line voids having a second width, and a first semiconductor material is deposited into the backbone line voids.

20. The integrated circuit of claim 19 wherein the remaining spacer material is removed thereby leaving one or more spacer material line voids having a first width and one or more other spacer material line voids having a second width, and a second semiconductor material is deposited into the spacer material line voids.

* * * * *